United States Patent
Nakamura et al.

(10) Patent No.: US 8,710,933 B2
(45) Date of Patent: Apr. 29, 2014

(54) OSCILLATION CIRCUIT

(75) Inventors: Takayuki Nakamura, Tokyo (JP); Minoru Sakai, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 62 days.

(21) Appl. No.: 13/478,840

(22) Filed: May 23, 2012

(65) Prior Publication Data

US 2012/0313718 A1 Dec. 13, 2012

(30) Foreign Application Priority Data

Jun. 10, 2011 (JP) ................................. 2011-130441

(51) Int. Cl.
*H03B 1/00* (2006.01)
*H03L 5/00* (2006.01)

(52) U.S. Cl.
USPC .............................. 331/74; 331/182; 331/185

(58) Field of Classification Search
USPC ................. 331/74, 182, 185, 108 R
See application file for complete search history.

(56) References Cited

U.S. PATENT DOCUMENTS

| | | | | |
|---|---|---|---|---|
| 7,579,917 B2 * | 8/2009 | Sakai et al. | ...................... | 331/74 |
| 7,768,358 B2 * | 8/2010 | Inoue | ............................... | 331/74 |
| 2003/0098749 A1 * | 5/2003 | Terasawa et al. | ................ | 331/74 |
| 2006/0244546 A1 | 11/2006 | Yamamoto | | |

FOREIGN PATENT DOCUMENTS

JP 2006-311379 11/2006

* cited by examiner

*Primary Examiner* — Joseph Chang
(74) *Attorney, Agent, or Firm* — IPUSA, PLLC

(57) ABSTRACT

A disclosed oscillation circuit includes a constant-voltage generation circuit, an oscillation generation circuit configured to generate an oscillation output, an output circuit including a plurality of parallelly arranged MOSFET circuits, to which a constant voltage generated by the constant-voltage generation circuit is supplied as a supply voltage, output points of the plurality of MOSFET circuits being mutually connected, and a drive circuit configured to drive a selected MOSFET circuit selected in response to a selection input among the plurality of MOSFET circuits by the oscillation output, wherein an output from an unselected MOSFET circuit among the plurality of MOSFET circuits other than the selected MOSFET circuits has a high impedance.

10 Claims, 6 Drawing Sheets

OSCILLATION CIRCUIT

CROSS-REFERENCE TO RELATED APPLICATIONS

This patent application is based upon and claims the benefit of priority of Japanese Patent Application No. 2011-130441 filed on Jun. 10, 2011, the entire contents of which are incorporated herein by reference.

BACKGROUND OF THE INVENTION

1. Field of the Invention

The present invention generally relates to an oscillation circuit including a MOSFET driven by an oscillation output.

2. Description of the Related Art

It is preferable for an oscillation circuit to output an oscillation waveform having a predetermined oscillating frequency f irrespective of existence of a load or a load current. Therefore, an output stage circuit for ensuring a capability of driving the load and relaxing an influence of the load is necessary.

FIG. 1 illustrates an exemplary output stage circuit 50 of a conventional oscillation circuit 50. The output stage circuit includes a CMOS inverter with which an oscillation output from the oscillation output generation circuit 80 is input in transistors $M_H$ and $M_L$. The output waveform from the CMOS inverter is output to a load 60 as an oscillation waveform having a predetermined frequency f via an output terminal 63. The electric current flowing through the load 60 is supplied from a constant voltage source 71.

However, if the impedance of the load outwardly connected to the oscillation circuit is changed, a capability of driving the load cannot be adjusted so as to be suitable for the changed impedance of the load with the conventional technique. Therefore, if plural variations exist in the load outwardly connected to the oscillation circuit, the oscillation circuit can be hardly adjusted in response to the variations.

[Patent Document 1] Japanese Laid-open Patent Publication No. 2006-311379

SUMMARY OF THE INVENTION

Accordingly, embodiments of the present invention may provide a novel and useful oscillation circuit, which can change a capability of driving a load, solving one or more of the problems discussed above.

Means for Solving Problems

According to an aspect of the embodiment, there is provided an oscillation circuit includes a constant-voltage generation circuit, an oscillation generation circuit configured to generate an oscillation output, an output circuit including a plurality of MOSFET circuits arranged in parallel, to which a constant voltage generated by the constant-voltage generation circuit is supplied as a supply voltage, output points of the plurality of MOSFET circuits being mutually connected, and a drive circuit configured to drive a selected MOSFET circuit selected in response to a selection input among the plurality of MOSFET circuits by the oscillation output, wherein an output from an unselected MOSFET circuit among the plurality of MOSFET circuits other than the selected MOSFET circuits has a high impedance.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Reference symbols typically designate as follows:
20: temperature compensation circuit;
30: voltage-controlled crystal oscillator (VCXO);
35: crystal unit;
36: output stage circuit;
40: memory;
50: oscillation circuit;
60: load;
61: supply voltage input terminal;
63: oscillating frequency output terminal;
70: constant-voltage generation circuit;
71: constant-voltage source;
80: oscillation output generation circuit;
90: output circuit;
91: drive circuit;
100: oscillation circuit;
200: temperature-compensated crystal oscillator;
A1-A6,S1-S6: switch circuit;
D0: CMOS inverter;
D1,D2,D3: MOSFET circuit; and
W1,W2,W3: NOT circuit.

A description is given below, with reference to the figures of the embodiments of the present invention.

First Embodiment

Figure 1:
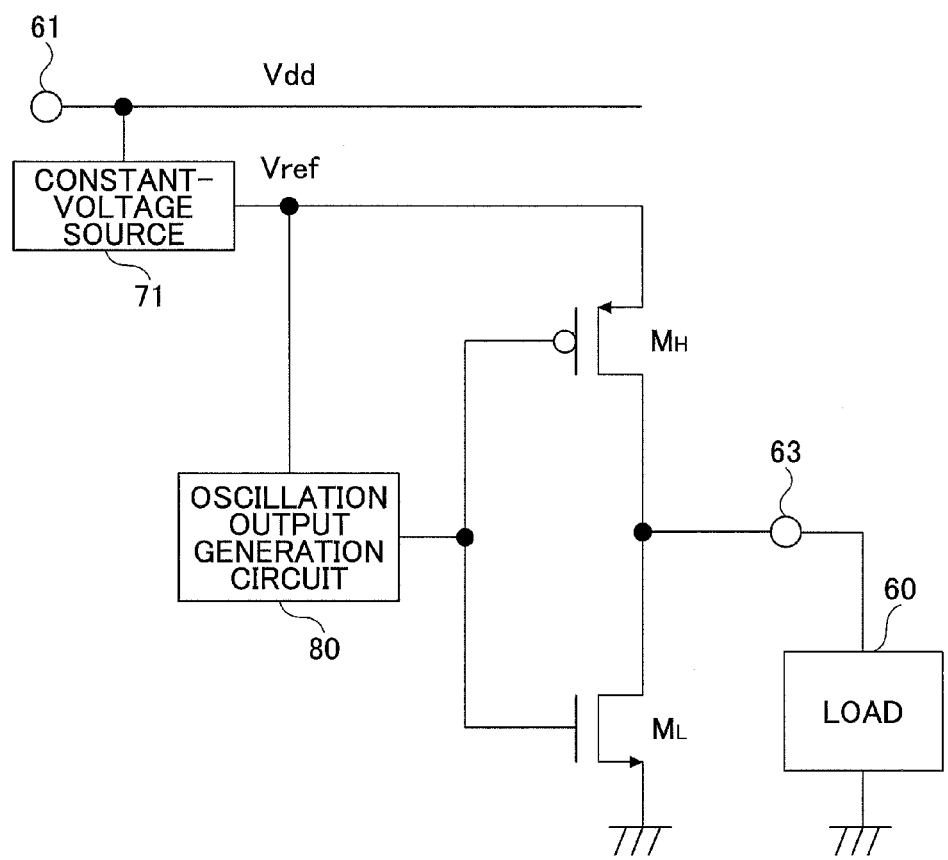
FIG. 1 illustrates an exemplary output stage circuit of a conventional oscillation circuit 50.
Figure 2:
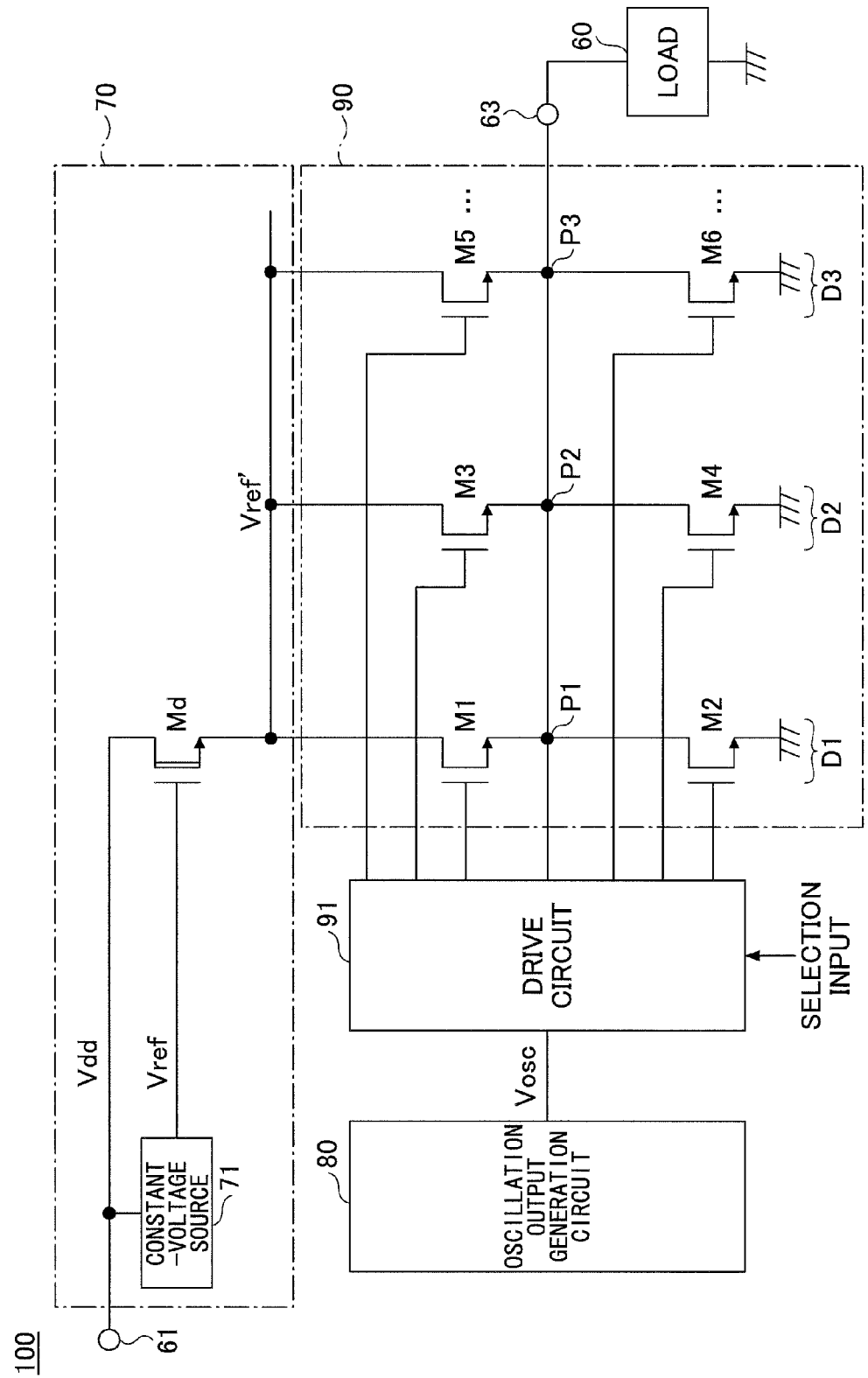
FIG. 2 is a block chart of an oscillation circuit of a first embodiment of the present invention.

FIG. 2 is a block chart of an oscillation circuit 100 of a first embodiment of the present invention. The oscillation circuit 100 includes a constant-voltage generation circuit 70, an oscillation output generation circuit 80, an output circuit 90 and a drive circuit 91.

The constant-voltage generation circuit 70 is satisfactory if it can generate a constant voltage Vref. FIG. 2 illustrates the constant-voltage generation circuit 70 including a constant-voltage source 71 and a transistor Md as a depression-type n-channel MOSFET. The constant-voltage source 71 generates a predetermined reference voltage Vref based on a supply voltage Vdd input from a supply voltage input terminal 61. The constant-voltage source 71 may be a resistance voltage dividing circuit or the like. The constant-voltage source 71 is preferably a regulator in order to stabilize the reference voltage Vref. The supply voltage Vdd is supplied to the drain of the transistor Md, and the reference voltage Vref is supplied to the gate. If the transistor Md is the depression-type n-channel MOSFET, a constant voltage Vref' substantially the same as the reference voltage Vref can be generated on the side of the source of the transistor Md. Further, it is possible to prevent the reference voltage Vref from varying by a variation of the electric current supplied to the load 60.

It is sufficient that the oscillation output generation circuit 80 generates an oscillation output Vosc having a predetermined frequency. An embodiment of the oscillation output generation circuit 80 is a crystal oscillator (XO) using a frequency-selective element. An example of the frequency-selective element of the crystal oscillator is a crystal unit. Other examples of the frequency-selective element are a mechanical resonator such as a ceramic resonator, a dielectric resonator, a LC tuning circuit, and so on.

The output circuit 90 includes plural parallelly-arranged MOSFET circuits D1, D2 and D3, to which the constant voltage Vref' generated by the constant-voltage generation circuit 70 is supplied as the supply voltage. Output points P1, P2 and P3 of the plural MOSFET circuits D1, D2 and D3 are mutually connected. FIG. 2 illustrates the MOSFET circuit D1 in which a transistor M1 being a high-side n-channel MOSFET and a transistor M2 being a low-side n-channel MOSFET are connected in serial. The output point P1 of the MOSFET circuit D1 corresponds to a connection point between the transistor M1 and the transistor M2. The MOSFET circuits D2 and D3 have the same structure as those of the MOSFET circuit D1 as illustrated in FIG. 2.

FIG. 2 illustrates a case where the high-side and low-side transistors are the n-channel type in order to reduce the sizes of the MOSFET circuits. However, it is not limited only to the combination of the n-channel MOSFET. A combination of a p-channel MOSFET and an n-channel MOSFET and a combination of p-channel MOSFETs are acceptable.

The drive circuit 91 drives the MOSFET, which is included in at least one MOSFET circuit selected among the plural MOSFET circuits D1, D2 and D3 in response to a selection input, in conformity with the oscillation output Vosc having a predetermined frequency generated by the oscillation output generation circuit 80. The drive circuit 91 drives the unselected MOSFET circuit which is not selected as the result of the selection input so that the output from the unselected MOSFET circuit has a high impedance.

Accordingly, an output waveform having a predetermined frequency corresponding to the frequency of the oscillation output Vosc is output to the load 60 as the oscillation waveform output from the oscillation circuit 100. The load 60 is, for example, a phase comparator or the like of a phase synchronizing circuit (a PLL circuit).

With the above oscillation circuit 100, the number of the parallelly-arranged MOSFET circuits for driving the load 60 can be increased or decreased in response to the selection input. Therefore, the capability of driving the load 60 can be changed by changing the output impedance of the output terminal 63 of the oscillation circuit 100.

For example, the number of the MOSFET circuits parallelly driving the load 60 is increased more as the impedance if the load 60 becomes smaller. With this, even if the capacity of the load 60 is increased, it is possible to prevent the capability of driving the load 60 from lowering. The selection input supplied to the drive circuit 91 may be changed in response to the change of the impedance of the load 60. As the impedance of the load 60 becomes smaller, the selection input causing the number of the MOSFET circuits driving the load 60 to increase is supplied from the other circuit.

Even if there are plural variations in the load 60 externally connected to the output terminal 63, the capability of driving the loads can be changed without changing the design of the oscillation circuit 100.

Second Embodiment

Figure 3:
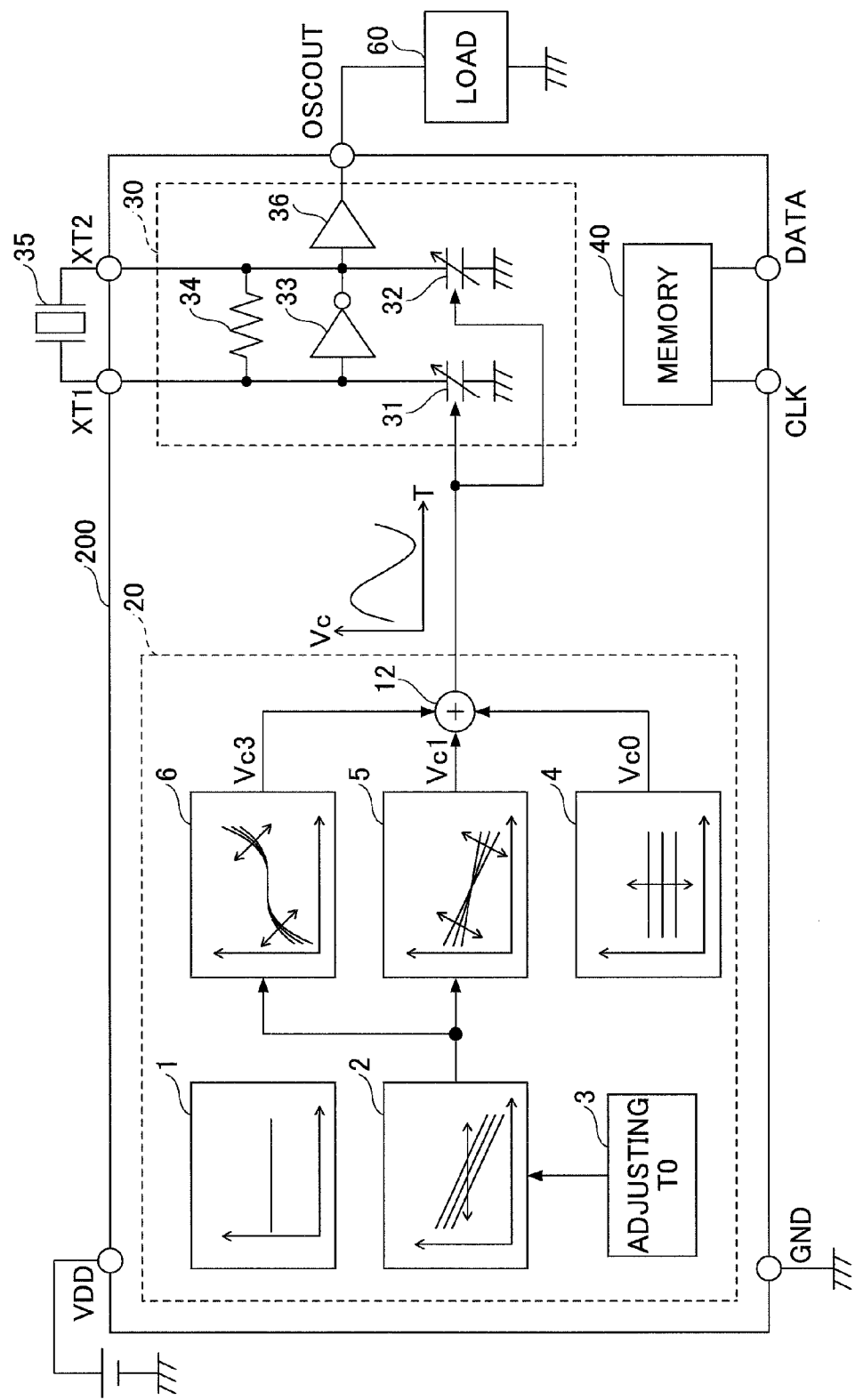
FIG. 3 is a block chart of an oscillation circuit of a second embodiment of the present invention.

The second embodiment is described next as a more specific example than that on the first embodiment illustrated in FIG. 2. FIG. 3 is a block chart of a temperature-compensated crystal oscillator (TCXO) 200 of the second embodiment of the present invention. The TCXO 200 includes an integrated circuit (IC). The TCXO 200 is an oscillation circuit including a temperature compensation circuit 20, a voltage-controlled crystal oscillator (VCXO) 30 in which a crystal unit 35 of an AT cut as a resonator, and a memory 40. The VCXO 30 includes the output stage circuit 36 (to be described in detail).

The temperature compensation circuit 20 is a function generation circuit for outputting a control voltage Vc of the VCXO 30. The temperature compensation circuit 20 compensates a variation of the oscillating frequency of the crystal unit 35 caused by a change in an ambient temperature T by applying a control voltage Vc generated based on an ambient temperature T, which is detected by a temperature detecting circuit 2.

For example, the control voltage Vc generated by the temperature compensation circuit 20 is obtainable by causing an adder to add voltages generated by, for example, a third-order component generation circuit 6, a first-order component generation circuit 5, and a zero-order component generation circuit 4. The control voltage Vc is approximated by a third-order function as follows:

$$Vc = \alpha(T-T0)^3 + \beta(T-T0) + \gamma, \quad \text{Formula 1}$$

where $\alpha$ is the coefficient of the third-order term, $\beta$ is the coefficient of the first-order term, $\gamma$ is the coefficient of the zero-order term, and T0 is the temperature at an inflection point of the third-order curve.

The VCXO 30 includes a CMOS inverter 33 to which input and output parts a crystal unit 35 is connected in parallel, a variable-capacitance element 31 connected between the input part and the ground of the CMOS inverter 33, a variable-capacitance element 32 connected between the output part of the CMOS inverter 33 and the ground, and a resistor 34 connected to the input and output parts of the CMOS inverter 33. An example of the variable-capacitance elements 31 and 32 is a variable-capacitance diode. The VCXO 30 outputs an oscillation waveform having a predetermined frequency f from a terminal OSCOUT in response to the control voltage Vc applied on both ends of the variable-capacitance elements 31 and 32.

The memory 40 stores data used by the temperature compensation circuit 20 for calculating $\alpha$, $\beta$, $\gamma$ and T0 in the formula 1. The data inside the memory 40 can be rewritten from an outside of the TCXO 200 via a CLK terminal and a DATA terminal. The memory 40 stores data adjusted for each product before shipment.

Referring to FIG. 3, the crystal unit 35 is externally attached to the TCXO 200 via terminals XT1 and XT2. The schematic structure illustrated in FIG. 3 is an example.

Figure 4:
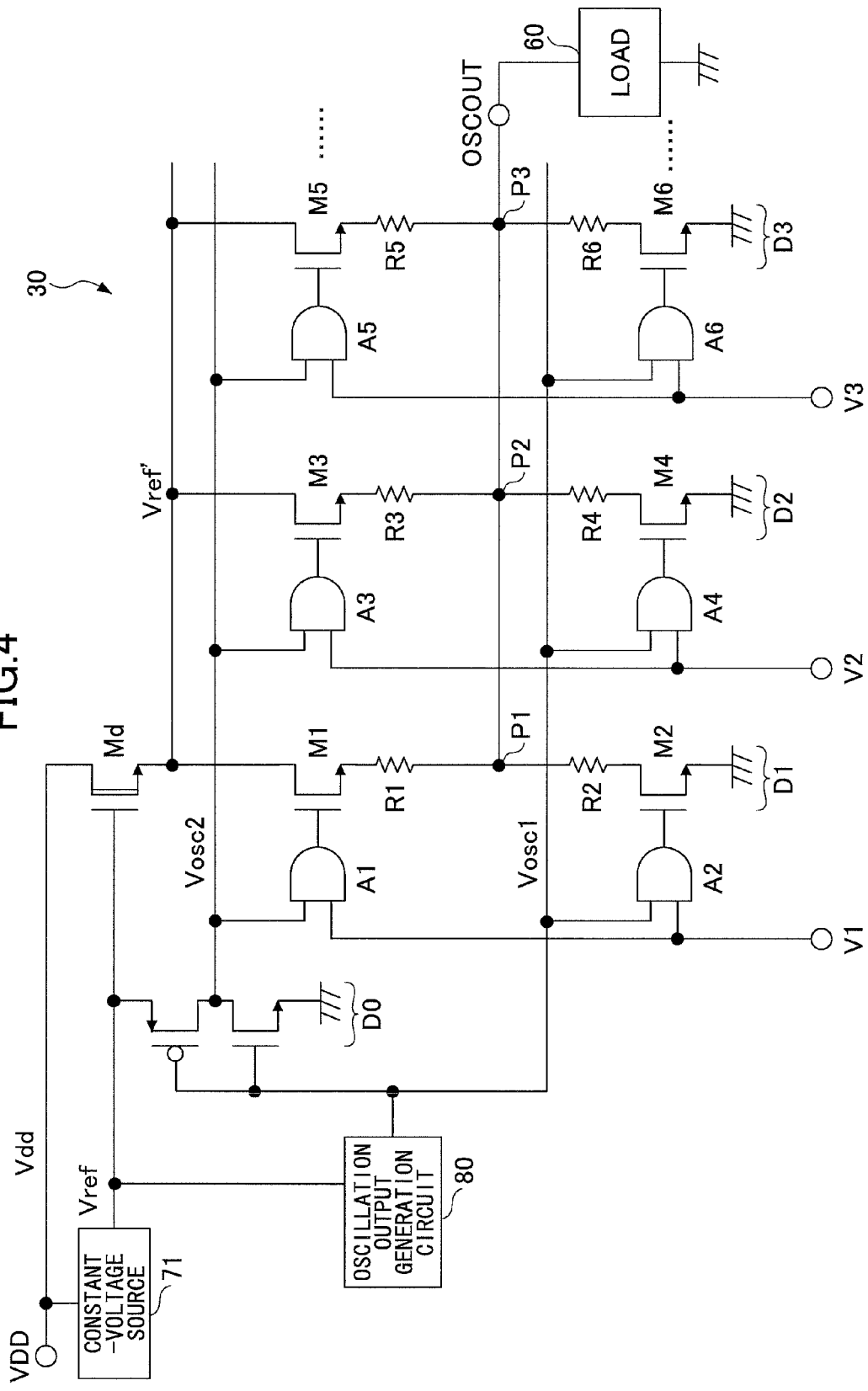
FIG. 4 illustrates a first exemplary structure of a voltage-controlled crystal oscillator (VCXO)

FIG. 4 illustrates a first exemplary structure of the voltage-controlled crystal oscillator (VCXO). The VCXO 30 includes an oscillation output generation circuit 80, an output circuit including MOSFET circuits D1, D2 and D3, and a drive circuit including switch circuits A1 to A6 and a CMOS inverter D0. The output circuit and the drive circuit correspond to the output stage circuit 36 illustrated in FIG. 3. Explanation of portions of the structure similar to the above is omitted.

The oscillation output generation circuit 80 is driven by the reference voltage Vref generated by a constant-voltage source 71 of the constant-voltage generation circuit 70 as a supply voltage. The oscillation output generation circuit 80 generates an oscillation output Vosc having a predetermined frequency (specifically, an oscillation output voltage Vosc1). By using the transistor Md as a buffer, it is possible to prevent a variation of the reference voltage Vref caused by a variation of the electric current supplied to the load 60. Therefore, it is possible to prevent a frequency variation of the oscillation output voltage Vosc1 caused by a variation of the reference voltage Vref (i.e., the supply voltage of the oscillation output generation circuit 80). Resultantly, a frequency variation of the oscillation waveform output to the load 60 from the terminal OSCOUT can be prevented.

The MOSFETs forming the MOSFET circuits D1, D2 and D3 and the CMOS inverter D0 are of an enhancement type.

Resistors R1, R2 and R3 are provided on high sides of the MOSFET circuits D1, D2 and D3 relative to the output points P1, P2 and P3. In order to match impedances of the high sides and low sides, resistors R2, R4 and R6 are provided on the low sides relative to the output points P1, P2 and P3. Referring to FIG. 4, the resistors R1, R3 and R5 are inserted between the sources of the n-channel transistors M1, M3 and M5 on the high side and the output points P1, P2 and P3, respectively. The resistors R2, R4 and R6 are inserted between the drains of the n-channel transistors M1, M3 and M5 on the low side and the output points P1, P2 and P3, respectively.

These resistances form a low-pass filter by combining with the capacitance of the load 60. Thus, a harmonic component included in the output waveform can be removed to thereby make the shape of the output waveform be like a clipped sine wave. These resistors can be substituted by an on-resistor of the MOSFET. By inserting the resistor as such, it is possible to easily match the resistance value.

The switch circuits A1, A3 and A5 form a logic AND circuit (an AND circuit) of a first group for determining whether the transistor on the high side is driven in response to the voltage of the selection input. The switch circuit A1 which outputs a binarized signal for driving the transistor M1 in response to the selection input voltage V1 is connected to the gate of the transistor M1 on the high side. The AND circuits A3 and A5 are configured in a manner similar to the AND circuit A1. The switch circuits A2, A4 and A6 form a logic AND circuit (an AND circuit) of a second group for determining whether the transistor on the low side is driven in response to the voltage of the selection input. The switch circuit A2 which outputs a binarized signal for driving the transistor M2 in response to the selection input voltage V1 is connected to the gate of the transistor M2 on the low side. The switch circuits A4 and A6 are configured in a manner similar to the switch circuit A2. The CMOS inverter D0 is driven in response to the oscillation output voltage Vosc1 output from the oscillation output generation circuit 80.

The oscillation output voltage Vosc2 (i.e., an inversion signal of Vosc1) from the CMOS inverter D0, to which the oscillation output voltage Vosc1 is input, is supplied as a signal input into the switch circuits A1, A3 and A5 on the high side. Meanwhile, the oscillation output voltage Vosc1 is supplied as a signal input into the switch circuits A2, A4 and A6 on the low side. The reference voltage Vref is supplied as the supply voltage to, the CMOS inverter D0. The constant voltage Vref' is supplied as the supply voltage to the MOSFET circuits D1, D2 and D3.

By configuring as such, a signal of the high or low level changing in response to the oscillation output voltage Vosc1 or Vosc2 is applied to the gates of the transistors forming the MOSFET circuits via the switch circuit of the high level, to which the selection input voltage of the high level is input. Meanwhile, the switch circuit, to which the selection signal of the low level is input, outputs a low level signal regardless of whether the oscillation output voltage Vosc1 or Vosc2 is input. When the signal of the low level in input in the gate of the transistor, the output of the transistor has a high impedance.

For example, when the selection input voltage is in a high level, the gate of the transistor M1 is driven by the switch circuit A1 using the oscillation output voltage Vosc2, and the gate of the transistor M2 is driven by the switch circuit A2 using the oscillation output voltage Vosc1. Meanwhile, when the selection input voltage V1 is in the low level, the transistor M1 is turned off by the switch circuit A1 and the transistor M2 is turned off by the switch circuit A2. The selection input voltages V2 and V3 are controlled in a manner similar to that in the voltage V1. Therefore, it is possible to change the capability of driving the load 60 by switching the selection input voltages V1, V2 and V3 to the low or high levels.

Further, if the selection input voltages V1, V2 and V3 are in the low levels, the outputs from the switch circuits A1 to A6 are in the low level. Then, the gates of all the transistors M1 to M6 forming the MOSFET circuit are in the low level. Thus, all the transistors M1 to M6 are turned off to thereby make the output points P1, P2 and P3 of the output circuit formed by the MOSFET circuits D1, D2 and D3 have a high impedance. Therefore, if it is unnecessary to output the oscillation waveform for inspecting a product, the OSCOUT terminal of the TCXO 200 can be used as an input or output terminal for another function of the oscillation circuit.

Data for determining a logic level (a high or low level) of the selection voltages V1, V2 and V3 are stored in, for example, the memory 40 illustrated in FIG. 3 in response to a desirable capability of driving the load 60. By confirming the logic levels of the selection input voltages V1, V2 and V3 by reading the data from the memory 40, it is possible to change the capability of driving the load 60. Further, by reading the data from a ROM inside the memory 40 at a time of starting the oscillation circuit to confirm the logic levels of the selection input voltages V1, V2 and V3, the output circuit of the oscillation circuit can be used in common even if the impedances of the loads are different between the loads (variations) 60 externally attached to the oscillation circuit.

Figure 5:
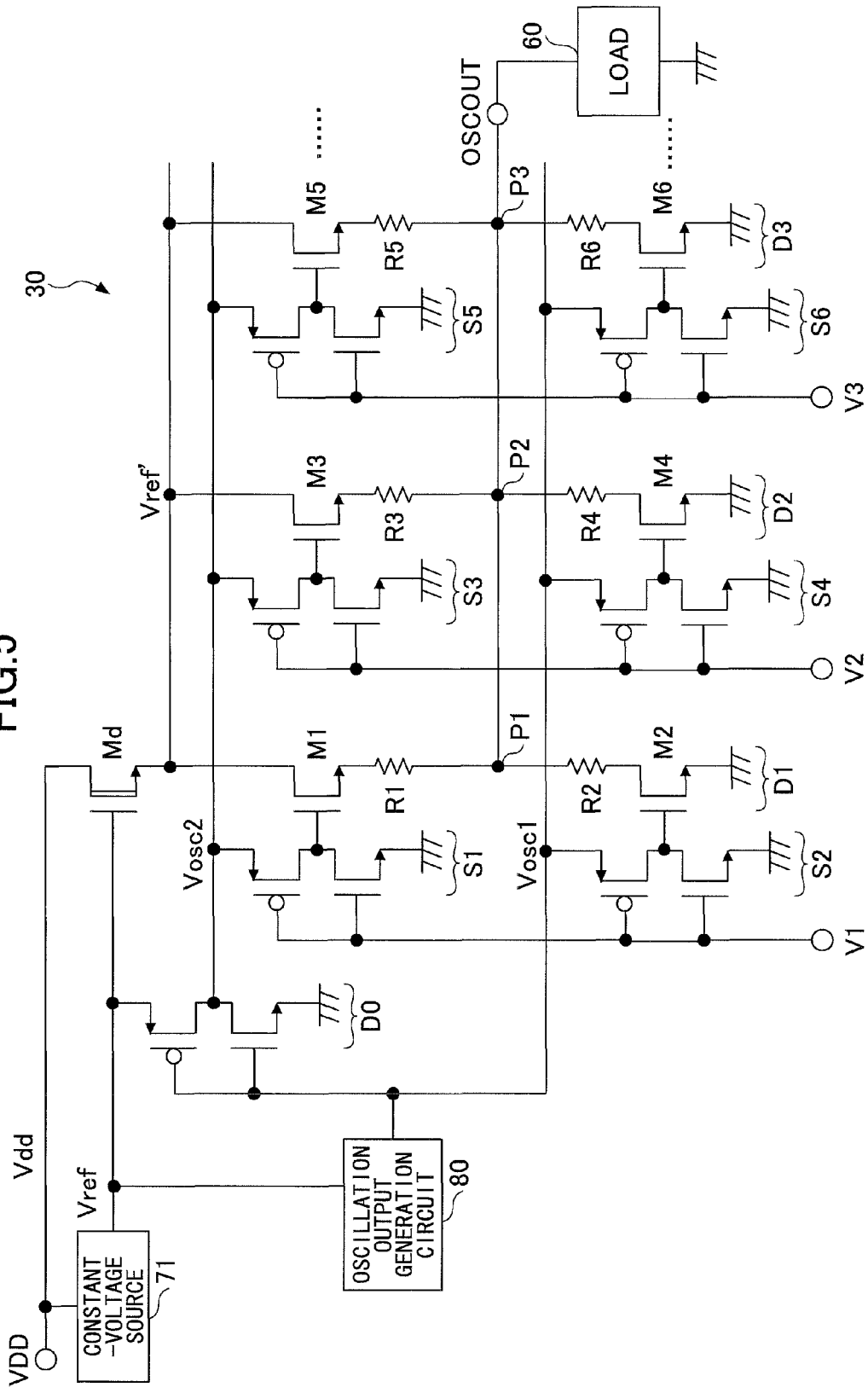
FIG. 5 illustrates a second exemplary structure of the VCXO.

FIG. 5 illustrates a second exemplary structure of the voltage-controlled crystal oscillator (VCXO). The VCXO 30 includes an oscillation output generation circuit 80, an output circuit including MOSFET circuits D1, D2 and D3, and a drive circuit including switch circuits S1 to S6 and a CMOS inverter D0. Explanation of portions of the structure similar to the above is omitted. MOSFETs forming the MOSFET circuits D1, D2 and D3, the switch circuits S1 to S6, and the CMOS inverter D0 are of an enhancement type.

The switch circuits S1, S3 and S5 form a transistor series circuit of a first group for determining whether transistors M1, M3 and M5 on a high side is driven in response to the voltage of an selection input. The switch circuit S1 which outputs a signal for driving the transistor M1 in response to a selection input voltage V1 is connected to the gate of the transistor M1 on the high side. The switch circuit S1 has a structure in which a MOSFET on the high side and a MOSFET on a low side are connected in series and the connection point between the MOSFET on the high side and the MOSFET on the low side is connected to the gate of the transistor M1. The switch circuits S3 and S5 are configured in a manner similar to the switch circuit S1. The switch circuits S2, S4 and S6 form a transistor series circuit of a second group for determining whether transistors M2, M4 and M6 on the low side is driven in response to the voltage of the selection input. The switch circuit S2 which outputs a signal for driving the transistor M2 in response to the selection input voltage V1 is connected to the gate of the transistor M2 on the low side. The switch circuit S2 has a structure in which a MOSFET on the high side and a MOSFET on a low side are connected in series and the connection point between the MOSFET on the high side and the MOSFET on the low side is connected to the gate of the transistor M2. The switch circuits S4 and S6 are configured in a manner similar to the switch circuit S2. Referring to FIG. 5, the transistors forming the switch circuits S1 to S6 are p-channel MOSFETs on the high side and n-channel MOSFETs on the low side. The CMOS inverter D0 is driven in response to the oscillation output voltage Vosc1 output from the oscillation output generation circuit 80.

The oscillation output voltage Vosc2 (i.e., an inversion signal of Vosc1) from the CMOS inverter D0, to which the oscillation output voltage Vosc1 is input, is supplied as a signal input into the switch circuits S1, S3 and S5 on the high side. Referring to FIG. 5, the oscillation output voltage Vosc2 is supplied to the source of the p-channel MOSFET on the high side forming the switch circuits S1, S3 and S5. Meanwhile, the oscillation output voltage Vosc1 is supplied as a signal input into the switch circuits S2, S4 and S6 on the low side. Referring to FIG. 5, the oscillation output voltage Vosc1 is supplied to the source of the p-channel MOSFET on the high side forming the switch circuits S2, S4 and S6. The reference voltage Vref is supplied as the supply voltage to the CMOS inverter D0. The constant voltage Vref is supplied as the supply voltage to the MOSFET circuits D1, D2 and D3.

The MOSFETs on the high and low sides forming the switch circuits S1 to S6 are gate-driven in response to the selection input. The signals in response to the selection inputs are input into the gates.

By configuring as such, the oscillation output voltage Vosc1 or Vosc2 is applied to the gates of the transistors forming the MOSFET circuits via the switch circuits, to which the selection input voltage of the low level is input. Meanwhile, the switch circuit, to which the selection signal of the high level is input, outputs a low level signal regardless of whether the oscillation output voltage Vosc1 or Vosc2 is input. When the signal of the low level in input in the gate of the transistor, the output of the transistor has a high impedance.

For example, if the selection input voltage V1 is in the low level, when the high side p-channel MOSFET of the switch circuit S1 is turned on, the gate of the transistor M1 is driven by the oscillation output voltage Vosc2, and when the high side p-channel MOSFET of the switch circuit S2 is turned on, the gate of the transistor M2 is driven by the oscillation output voltage Vosc1.

On the other hand, if the selection input voltage V1 is in the high level, when the low side n-channel MOSFET of the switch circuit S1 is turned on, the transistor M1 is turned off, and when the low side n-channel MOSFET of the switch circuit S2 is turned on, the transistor M2 is turned off. The selection input voltages V2 and V3 are controlled in a manner similar to that in the voltage V1. Therefore, it is possible to change the capability of driving the load 60 by switching the selection input voltages V1, V2 and V3 to the low or high levels.

Further, if the selection input voltages V1, V2 and V3 are in the high levels, all n-channel transistors in the switch circuits S1 to S6 are turned on. Then, the gates of all the transistors M1 to M6 forming the MOSFET circuit are grounded. Thus, all the transistors M1 to M6 are turned off to thereby make the output points P1, P2 and P3 of the output circuit formed by the MOSFET circuits D1, D2 and D3 have a high impedance. Therefore, if it is unnecessary to output the oscillation waveform for inspecting a product, an OSCOUT terminal of a TCXO 200 can be used as an input or output terminal for another function of the oscillation circuit.

Data for determining a logic level (a high or low level) of the selection voltages V1, V2 and V3 are stored in, for example, the memory 40 illustrated in FIG. 3 in response to a desirable capability of driving the load 60. By confirming the logic levels of the selection input voltages V1, V2 and V3 by reading the data from the memory 40, it is possible to change the capability of driving the load 60. Further, by reading the data from a ROM inside the memory 40 at a time of starting the oscillation circuit to confirm the logic levels of the selection input voltages V1, V2 and V3, the output circuit of the oscillation circuit can be used in common even if the impedances of the loads are different between the loads (variations) 60 externally attached to the oscillation circuit.

If the high side transistors M1, M3 and M5 are of the n-channel type, the high level of the oscillation waveform in the terminal OSCOUT is smaller than the gate voltage of the transistors M1, M3 and M5 by a gate threshold value (voltage) Vth. Said differently, the output amplitude of the oscillation waveform in the terminal OSCOUT becomes (Vref−Vth). Therefore, by adjusting the gate threshold value (voltage), an arbitrary output amplitude is obtainable.

The number of gates to be driven in the switch circuits S1 to S6 illustrated in FIG. 5 is smaller that in the switch circuits A1 to A6 formed by plural MOSFETs. Therefore, flicker noise and dispersion of a threshold level in the MOSFETs hardly occur to thereby enhance phase noise performance.

Because the high side and low side transistors forming the switch circuits S1 to S6 can be simple switches for switching to supply the oscillation output voltage Vosc1 or Vosc2 to the gates of the transistors M1 to M6, the sizes of the switch circuits S1 to S6 can be reduced in comparison with the switch circuits A1 to A6 requiring transistors capable of driving the transistors S1 to S6.

For example, the number of the MOSFET circuits is three in the above embodiments. However, the number may be two, four, or more than four. By increasing the number of the parallelly arranged MOSFETs, it is possible to improve a resolution capability of the capability of driving the load. If the number of the MOSFET circuit is one, it is possible to switch the impedance at the output point of the MOSFET circuit high or not high. Said differently, the capability of driving the load can be changed.

Within the above embodiments, the MOSFET circuit is the series circuit of the high side transistor and the low side transistor. However, if the electric current is suctioned from the load 60 to the ground, it is sufficient to form the MOSFET circuit only by a high side circuit including a high side transistor. On the contrary, if the electric current is suctioned from the power supply to the load 60, it is sufficient to form the MOSFET circuit only by a low side circuit including a low side transistor.

Within the above embodiment, the high side transistor is of the n-channel type. By partly changing the circuit structure, the p-channel type may be used.

With the above embodiment, the oscillation output voltage Vosc2 from the CMOS inverter is supplied as input signals to the switch circuits A1, A3, A5, S1, S3, and S5, and the oscillation output voltage Vosc1 is supplied as input signals to the switch circuits A2, A4, A6, S2, S4, and S6. However, on the contrary thereto, the oscillation output voltage Vosc2 from the CMOS inverter D0 may be supplied as input signals to the switch circuits A2, A4, A6, S2, S4, and S6, and the oscillation output voltage Vosc1 may be supplied as input signals to the switch circuits A1, A3, A5, S1, S3, and S5.

Figure 6:
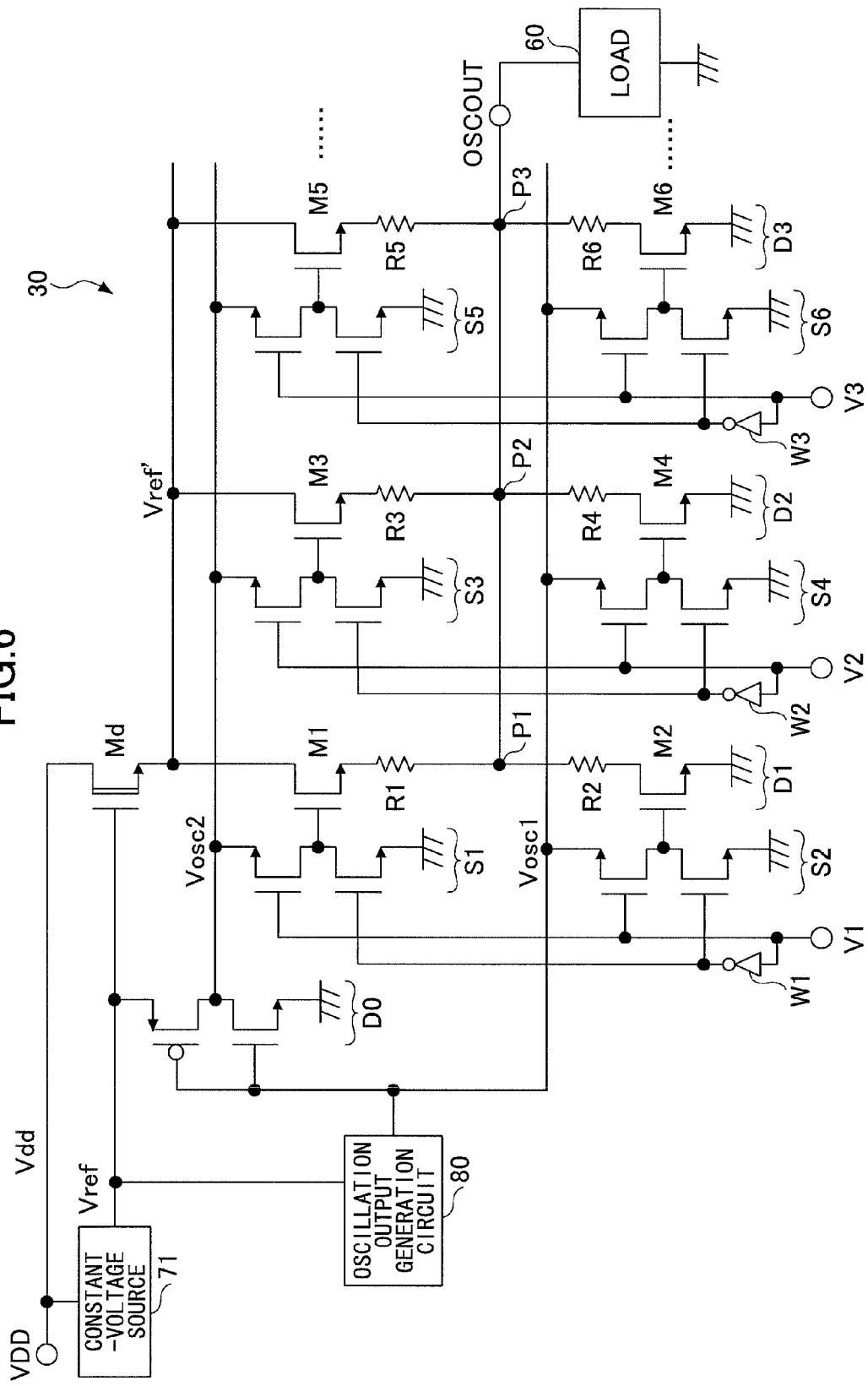
FIG. 6 illustrates a third exemplary structure of the VCXO.

Referring to FIG. 5, the switch circuits S1 to S6 are realized by combinations of the p-channel and n-channel transistors. However, the structure is not limited to this, a combination of the p-channel transistors or a combination of the re-channel transistors as illustrated in FIG. 6 may be used. Referring to FIG. 6, the selection input voltage V1 is input in the gates of low side re-channel MOSFETs respectively of switch circuits S1 and S2 via a NOT circuit W1. Switch circuits S3 and S4, to which a selection input voltage V2 is input, and switch circuits S5 and S6, to which a selection input voltage V3, are configured in a manner similar to the switch circuits S1 and S2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present invention have been described in detail, it should be understood that the various changes, substitutions, and alterations could be made hereto without departing from the spirit and scope of the invention.

What is claimed is:

1. An oscillation circuit comprising:
a constant-voltage generation circuit;
an oscillation generation circuit configured to generate an oscillation output;
an output circuit including a plurality of parallelly arranged MOSFET circuits, to which a constant voltage generated by the constant-voltage generation circuit is supplied as a supply voltage, output points of the plurality of MOSFET circuits being mutually connected; and
a drive circuit configured to drive a selected MOSFET circuit selected in response to a selection input among the plurality of MOSFET circuits by the oscillation output,
wherein an output from an unselected MOSFET circuit among the plurality of MOSFET circuits other than the selected MOSFET circuits has a high impedance.

2. The oscillation circuit according to claim 1,
wherein the plurality of the MOSFET circuits include a high side MOSFET and a low side MOSFET which are arranged in series, and
the output points are connection points between the high side MOSFETs and the low side MOSFETs.

3. The oscillation circuit according to claim 2,
wherein the plurality of the MOSFET circuits further include a first resistor on a high side of the connection point.

4. The oscillation circuit according to claim 3,
wherein the plurality of the MOSFET circuits further include a second resistor on a low side of the connection point.

5. The oscillation circuit according to claim 2,
wherein the high side MOSFETs and the low side MOSFETs are n-channel MOSFETs.

6. The oscillation circuit according to claim 2,
wherein the drive circuit includes
first switch circuits, which are respectively connected with gates of the high side MOSFETs, for determining whether the high-side MOSFETs are driven in response to the selection input,
second switch circuits, which are respectively connected with gates of the low side MOSFETs, for determining whether the low-side MOSFETs are driven in response to the selection input, and
a CMOS inverter driven by the oscillation output,
wherein an output voltage from the CMOS inverter is supplied as a first signal input to the first switch circuit and the second switch circuit, and
the oscillation output is supplied as a second signal input to the first switch circuit and the second switch circuit,
wherein outputs from the high side MOSFET and the low side MOSFET included in the unselected MOSFET circuit are controlled to have a high impedance.

7. The oscillation circuit according to claim 6,
wherein the first switch circuit includes a first switch circuit high side MOSFET for the first switch circuit and a first switch circuit low side MOSFET for the first switch circuit, which are connected in series, and
the second switch circuit includes a second switch circuit high side MOSFET for the second switch circuit and a second switch circuit low side MOSFET for the second switch circuit, which are connected in series.

8. The oscillation circuit according to claim 7,
wherein the first and second switch circuit high side MOSFETs and the first and second switch circuit low side MOSFETs are gate-driven in response to the selection input, and
an output voltage from the CMOS inverter or the oscillation output is supplied to the first and second switch circuit high side MOSFETs.

9. The oscillation circuit according to claim 6,
wherein the constant voltage generated by the constant-voltage generation circuit is supplied to the CMOS inverter as a supply voltage.

10. The oscillation circuit according to claim 9,
wherein the constant-voltage generation circuit includes
a constant voltage source for generating a predetermined constant voltage from a direct voltage, and
a depression-type n-channel MOSFET which receives the direct voltage through a drain of the depression-type n-channel MOSFET and the predetermined constant voltage through a gate of the depression-type n-channel MOSFET,
wherein the constant-voltage generation circuit supplies the predetermined constant voltage as the constant voltage to the CMOS inverter,
wherein a source voltage from the depression-type n-channel MOSFET is supplied as the supply voltage for the plurality of the MOSFET circuits.

* * * * *